United States Patent
Liu et al.

(10) Patent No.: US 8,748,949 B2
(45) Date of Patent: *Jun. 10, 2014

(54) CHIP PACKAGE WITH HEAVILY DOPED REGION AND FABRICATION METHOD THEREOF

(76) Inventors: Chien-Hung Liu, Taipei (TW); Cheng-Te Chou, Taipei (TW)

(*) Notice: Subject to any disclaimer, the term of this patent is extended or adjusted under 35 U.S.C. 154(b) by 142 days.

This patent is subject to a terminal disclaimer.

(21) Appl. No.: 12/940,607

(22) Filed: Nov. 5, 2010

(65) Prior Publication Data

US 2011/0042807 A1 Feb. 24, 2011

Related U.S. Application Data

(63) Continuation of application No. 12/788,091, filed on May 26, 2010, now Pat. No. 8,497,534.

(60) Provisional application No. 61/235,146, filed on Aug. 19, 2009, provisional application No. 61/235,153, filed on Aug. 19, 2009.

(51) Int. Cl.
*H01L 23/48* (2006.01)
*H01L 21/70* (2006.01)
*H01L 29/40* (2006.01)

(52) U.S. Cl.
USPC .................... 257/276; 257/502; 257/621

(58) Field of Classification Search
USPC .......................... 257/276, 502, 621
See application file for complete search history.

(56) References Cited

U.S. PATENT DOCUMENTS

| | | | | |
|---|---|---|---|---|
| 5,920,108 | A * | 7/1999 | Hemmenway et al. | 257/508 |
| 6,300,148 | B1 * | 10/2001 | Birdsley et al. | 438/15 |
| 2005/0051883 | A1 | 3/2005 | Fukazawa | |
| 2007/0170543 | A1 * | 7/2007 | Furukawa et al. | 257/520 |
| 2008/0142862 | A1 * | 6/2008 | Liao et al. | 257/303 |
| 2010/0171189 | A1 | 7/2010 | Liu | |
| 2010/0187697 | A1 | 7/2010 | Tsai et al. | |
| 2010/0314762 | A1 * | 12/2010 | Schrank et al. | 257/741 |
| 2011/0042781 | A1 * | 2/2011 | Liu | 257/507 |
| 2011/0042804 | A1 * | 2/2011 | Liu et al. | 257/737 |
| 2011/0042807 | A1 | 2/2011 | Liu et al. | |

FOREIGN PATENT DOCUMENTS

CN 101232002 A 7/2008
DE 10 2007 034 306 B3 4/2009

* cited by examiner

*Primary Examiner* — James Mitchell
(74) *Attorney, Agent, or Firm* — Birch, Stewart, Kolasch & Birch, LLP

(57) ABSTRACT

The invention provides a chip package and fabrication method thereof. In one embodiment, the chip package includes: a semiconductor substrate having opposite first and second surfaces, at least one bond pad region and at least one device region; a plurality of conductive pad structures disposed on the bond pad region at the first surface of the semiconductor substrate; a plurality of heavily doped regions isolated from one another, underlying and electrically connected to the conductive pad structures; and a plurality of conductive bumps underlying the heavily doped regions and electrically connected to the conductive pad structures through the heavily-doped regions.

25 Claims, 11 Drawing Sheets

CHIP PACKAGE WITH HEAVILY DOPED REGION AND FABRICATION METHOD THEREOF

CROSS REFERENCE TO RELATED APPLICATIONS

This application is a continuation of U.S. patent application Ser. No. 12/788,091 filed on May 26, 2010, now U.S. Pat. No. 8,497,534 which claims priority of Provisional U.S. Patent Application Nos. 61/235,146 and 61/235,153, both filed on Aug. 19, 2009, the entirety of which is incorporated by reference herein.

BACKGROUND OF THE INVENTION

1. Field of the Invention

The invention relates to a chip package, and in particular, to a wafer-level chip package and fabrication method thereof.

2. Description of the Related Art

A wafer level packaging technique for chip packaging has been developed. A wafer level package is first completed and then a dicing step is performed to form separated chip packages. A redistribution pattern in a chip package is mainly designed to be in direct contact with metal pads. Thus, the process for forming the redistribution pattern must correspond with the design of the metal pads.

It is desired to have a novel chip package and a fabrication method thereof to address the above issues.

BRIEF SUMMARY OF THE INVENTION

According to one aspect of the invention, a chip package is provided. An exemplary chip package comprises: a semiconductor substrate having opposite first and second surfaces, at least one bond pad region, and at least one device region; a plurality of conductive pad structures disposed on the bond pad region at the first surface of the semiconductor substrate; a plurality of heavily doped regions isolated from one another, underlying and electrically connected to the conductive pad structures; and a plurality of conductive bumps underlying the heavily doped regions and electrically connected to the conductive pad structures through the heavily doped regions.

According to another aspect of the invention, a method for fabricating a chip package is provided. An exemplary method comprises: providing a semiconductor wafer having opposite first and second surfaces, wherein the semiconductor wafer comprises at least one bond pad region, at least one device region, and a plurality of conductive pad structures on the first surface and disposed on the bond pad region; forming a plurality of heavily doped regions underlying the conductive pad structures, wherein the heavily-doped regions are isolated from one another and electrically connected to the conductive pad structures; and forming a plurality of conductive bumps underlying the heavily-doped regions, wherein the conductive bumps are electrically connected to the conductive pad structures through the heavily doped regions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
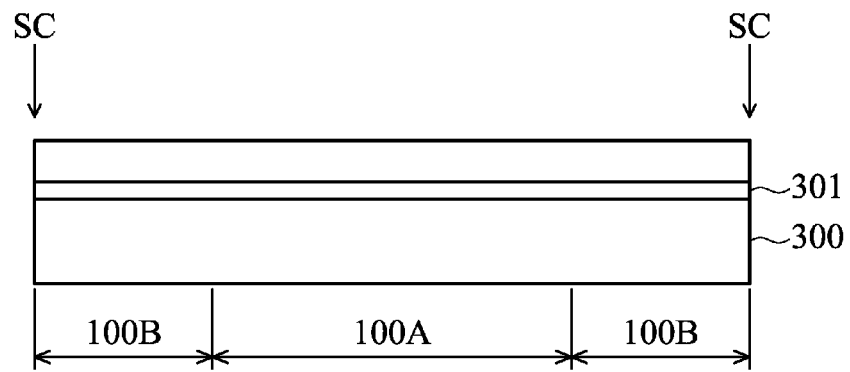
FIGS. 1-2 are cross sections showing a method for fabricating a semiconductor chip according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

In the drawings or the description, similar or same reference numerals are used to designate similar or same elements. In addition, shapes or thickness of elements shown in the drawings may be exaggerated for clarity or simplicity. Further, each element shown in the drawings will be described. It should be understood that any element not shown or described may be any kind of conventional element as known by those skilled in the art. In addition, the disclosed embodiment is merely a specific example for practicing the invention, without acting as a limitation upon its scope.

A CMOS image sensor device package is used as an example. However, a micro-electromechanical system (MEMS) chip package or other semiconductor chips may also be suitable for use. That is, it should be appreciated that the chip package of the embodiments of the invention may be applied to electronic components with active or passive devices, or digital or analog circuits, such as opto electronic devices, micro-electromechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

According to a feature of the invention, the electrical connections between conductive pad structures and conductive bumps are achieved by the use of heavily doped regions. As such, it is not necessary for a redistribution pattern to be in direct contact with conductive pad structures. In one embodiment, the heavily doped regions are disposed in the semiconductor substrate underlying the conductive pad structures. In another embodiment, the heavily doped regions are disposed in a carrier substrate bonded to the semiconductor substrate.

Figure 2:
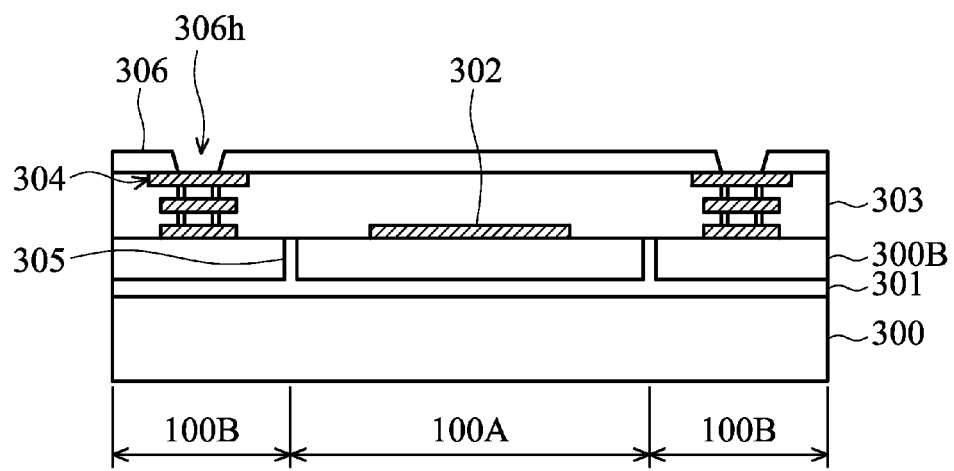

Referring to FIGS. 1-2, cross-sectional views illustrating the steps for forming a chip package on a semiconductor wafer according to an embodiment of the invention are shown. In this embodiment, the heavily doped regions are disposed in the semiconductor substrate underlying the conductive pad structures. As shown in FIGS. 1-2, a semiconductor wafer 300 is first provided, which is typically a silicon wafer. The semiconductor wafer includes an insulating layer 301, which may be formed by semiconductor processing steps such as a thermal oxidation or chemical vapor deposition step. In one embodiment, a silicon-on-insulator (SOI) substrate may be used. Alternatively, the semiconductor wafer may be formed by combing two wafers together, using a wafer bonding process, wherein one of the wafers is provided with an insulating layer. The semiconductor wafer are defined with a plurality of device regions 100A surrounded by peripheral bonding pad regions 100B. Thereafter, insulating walls 305 connecting to the insulating layer 301 are formed in the semiconductor wafer 300 to isolate a plurality of regions as heavily doped regions 300B. A semiconductor device 302 such as an image sensor device or MEMS is fabricated in the device region 100A. Overlying the semiconductor wafer 300 and the semiconductor device 302 is an intermetal dielectric (IMD) layer 303, which is typically a low-k dielectric such as porous oxide. A plurality of conductive pad structures 304 are fabricated in the IMD layer 303 on the peripheral bonding pad regions 100B. The insulating walls and the insulating layer may be formed of an insulating material such as silicon oxide, or an insulation space such as air gap or vacuum. The conductive pad structures 304 are preferably made of materials such as copper (Cu), aluminum (Al), or other suitable metals. It should be noted that the semiconductor wafer comprises a plurality of heavily doped region 300B in the peripheral bonding pad regions 100B, wherein the heavily doped regions 300B are isolated by insulating walls 305 and electrically connected to the conducive pad structures 304. The heavily doped regions 300B may be formed by doping ions (e.g., phosphors or arsenic ions) of a high concentration (e.g., $1E14$-$6E15$ atoms/cm$^2$) by, for example, diffusion or ion implantation processes, to form a conductive path. In an embodiment, one heavily doped region corresponds to one conductive pad structure. However, when a plurality of conductive pad structures are used as a common output, one heavily doped region may correspond to a plurality of conductive pad structures at the same time.

In addition, the semiconductor wafer 300, produced by wafer foundries, may be covered with a chip passivation layer 306. Meanwhile, in order to electrically connect the devices in the chip to external circuits, the chip passivation layer 306 may be defined in advance by wafer foundries to form a plurality of openings 306h exposing the conductive pad structures 304.

Figure 3A:
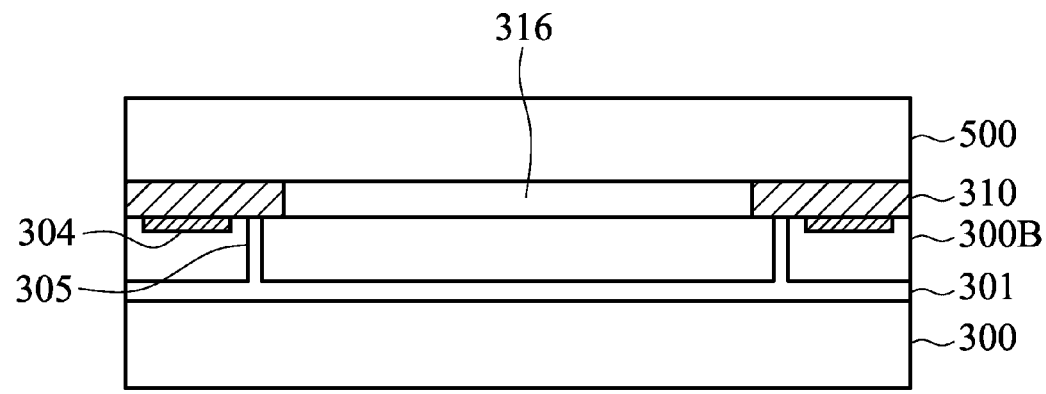
FIGS. 3A-3G are cross sections showing a method for fabricating a carrier wafer according to another embodiment of the invention.

Next, as shown in FIG. 3A, a packaging layer 500 is bonded to the semiconductor wafer. For simplicity, only the conductive pad structures 304, the insulating walls 305, and the insulating layer 301 are shown in the semiconductor wafer 300. The packaging layer 500 may be, for example, a transparent substrate such as glass, another blank silicon wafer, or another wafer having integrated circuits. In one embodiment, a spacer layer 310 is used to separate the packaging layer 500 and the semiconductor substrate such that a cavity 316 surrounded by the spacer layer 310 is formed. The spacer layer 310 may be a sealant resin or a photosensitive insulating material, such as epoxy, solder mask, and so on. In addition, the spacer layer 310 may be formed on the semiconductor wafer 300, and then bonded with the opposing packaging layer 500 using an adhesion layer. On the other hand, the spacer layer 310 may also be formed on the packaging layer 500, and then bonded with an opposing semiconductor substrate 300 using an adhesion layer.

Figure 3B:
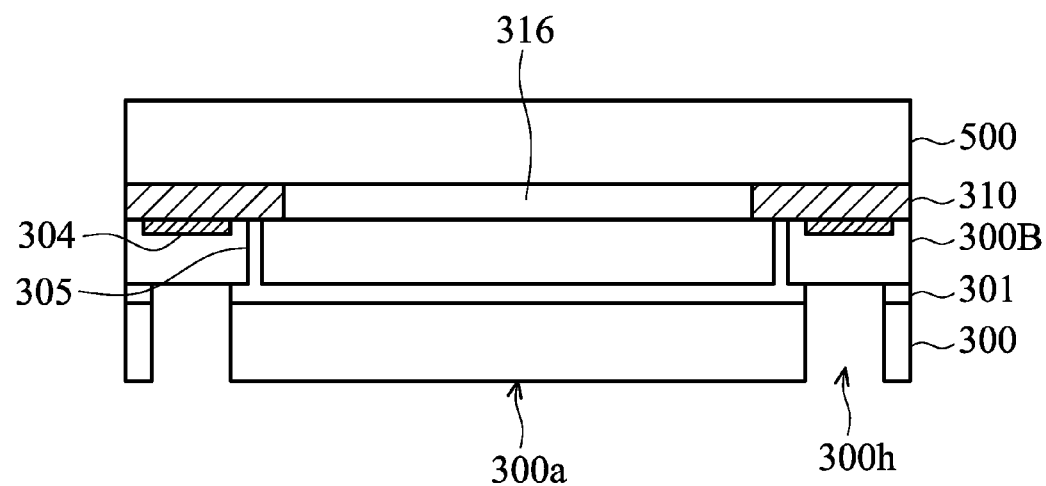

Referring to FIG. 3B, using the packaging layer 500 as a supporting substrate, the backside 300a of the semiconductor wafer is etched by, for example, an anisotropic etch process, to remove portions of the semiconductor wafer 300 and the insulating layer 301 to form openings 300h therethrough to expose the heavily doped regions 300B. It should be noted that each of the openings 300h corresponds to the heavily doped regions 300B in the peripheral bonding pad regions 100B isolated by the insulating walls 305.

Figure 3C:
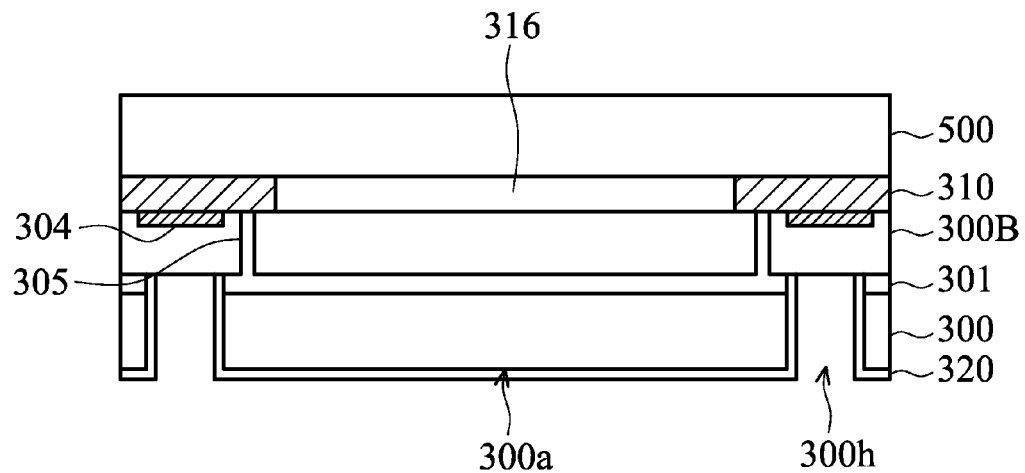

As shown in FIG. 3C, an insulating layer 320 which exposes the heavily doped regions 300B is formed in the openings 300h. The insulating layer 320 may be a silicon oxide layer formed by thermal oxidation or plasma chemical vapor deposition processes. For example, the insulating layer 320 may be formed in the openings 300h and extend to the backside 300a of the semiconductor wafer 300, and then the portion of the insulating layer at the bottom of the openings 300h would be removed by conventional photolithography and etching processes to expose the heavily doped regions 300B.

Figure 3D:
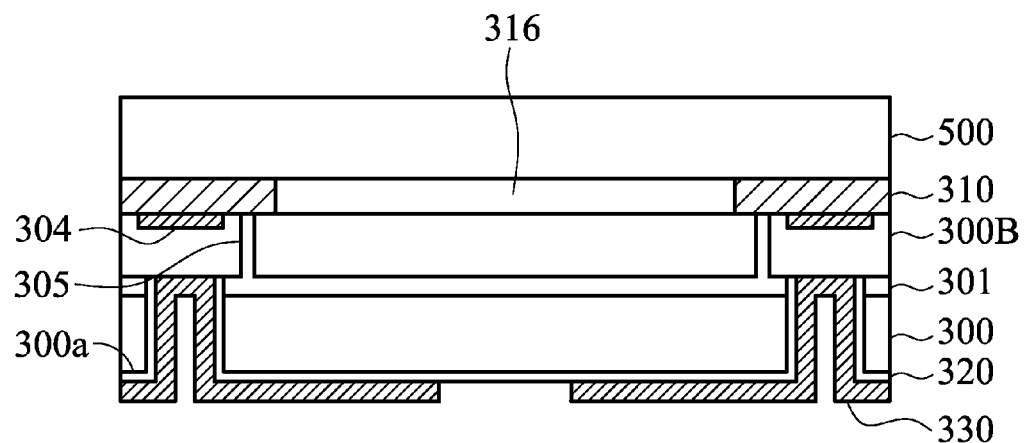

Next, as shown in FIG. 3D, a conductive pattern 330 is formed in the openings 300h. In this embodiment, the conductive pattern serves as a redistribution pattern and therefore, the conductive pattern is formed on the sidewalls of the openings 300h and further extended to the bottom surface 300a of the semiconductor wafer 300a and the heavily doped regions 300B. The redistribution pattern 330 may be formed by physical vapor deposition, chemical vapor deposition, electroplating, and eletroless plating processes, and so on. The redistribution pattern 330 may be formed of metals such as copper, aluminum, gold, or combinations thereof. Alternatively, the redistribution pattern 330 may be formed of conductive oxides such as indium tin oxide (ITO), indium zinc oxide (IZO), or a combination thereof. In one embodiment, a conductive layer is conformally formed on the entire semiconductor wafer, and then patterned to form the redistribution pattern as shown in FIG. 3D.

Figure 3E:
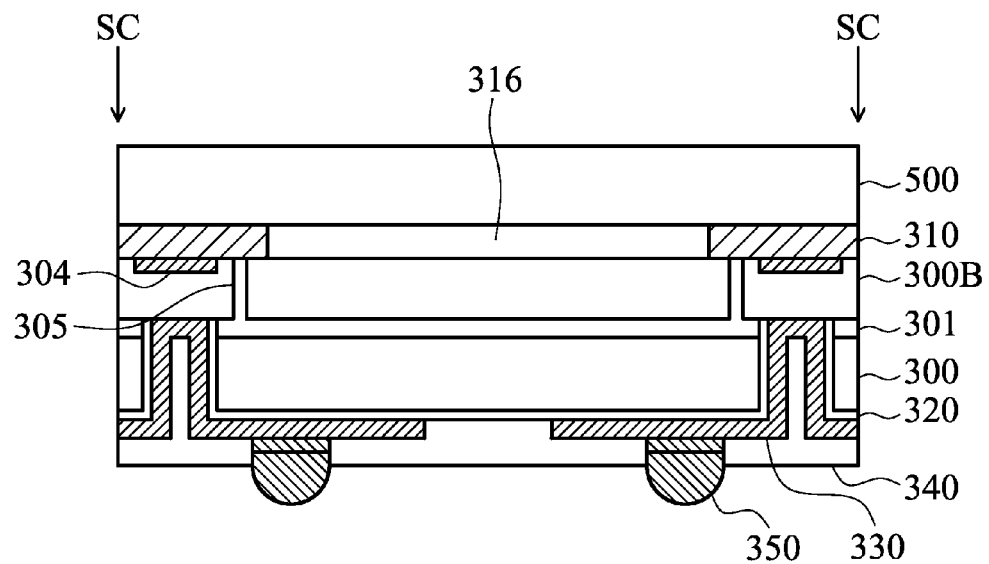

Thereafter, referring to FIG. 3E, the formation of a passivation layer 340 is shown. In an embodiment of the invention, the passivation layer 340 may, for example, be a solder mask. A solder mask material may be applied overlying the backside 300a of the semiconductor wafer to form the passivation layer 340. Then, the passivation layer 340 is patterned to form a plurality of terminal contact openings, exposing portions of the redistribution pattern 330. Then, an under bump metallurgy (UBM) and a conductive bump 350 are formed at the terminal contact openings. For example, the UBM may be formed of a conductive material such as a metal or metal alloy, and may be nickel, silver, aluminum, cooper, or alloys thereof. Alternatively, the UBM may be a doped polysilicon, single crystalline silicon, or conducting glass layer. In addition, a refractory metal material such as titanium, molybdenum, chromium, or titanium-tungsten layer may be used alone or in combination with other metal layers. In a specific embodiment, a nickel/gold layer may be partially or entirely formed overlying a surface of the metal layer. Through the redistribution pattern 330, the conductive bumps 350 may be electrically connected to the heavily doped regions 300B instead of the conductive pad structures 304. In an embodiment of the invention, the conductive bump 350 is used to transmit input/output (I/O), ground, or power signals of the device 302. Subsequently, the semiconductor wafer is diced along the scribe line SC on the peripheral bonding pad region, to thereby form a plurality of chip packages.

The heavily doped regions 300B in the peripheral bonding pad regions are isolated by the insulating walls 305. Therefore, the redistribution pattern 330 can electrically connect to the heavily doped regions 300B, and it is not necessary for the redistribution pattern to be in direct contact with the conductive pad structures 304. In addition, the heavily doped regions 300B in the peripheral bonding pad regions may have an area that is wider than that of the conductive pad structures 304 such that the contact openings 300h have a larger process window for alignment.

Figure 3F:
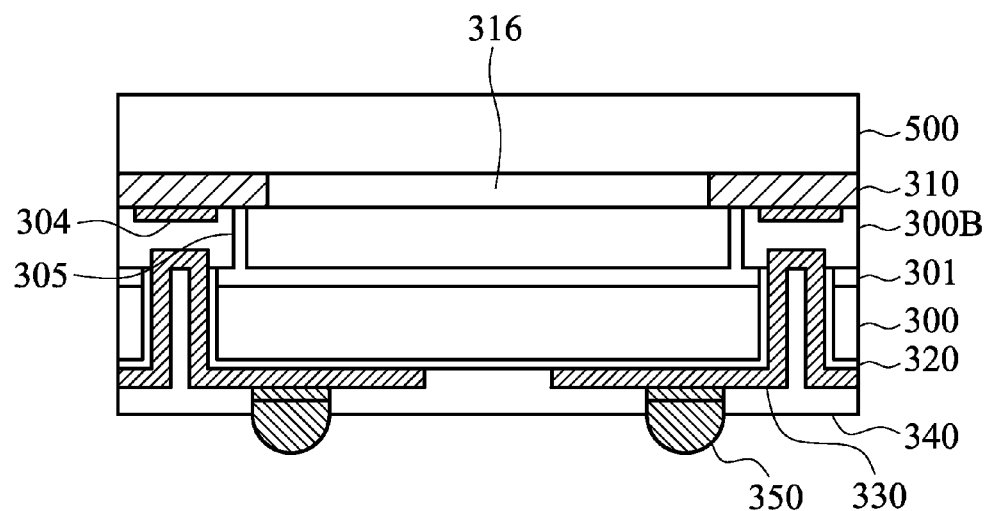
Figure 3G:
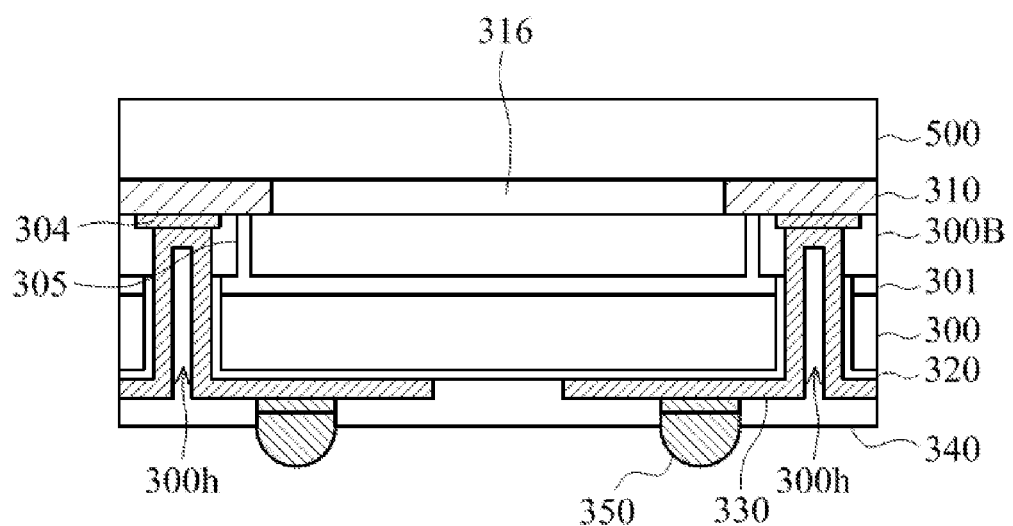

Furthermore, as shown in FIG. 3F, the depth of the opening 300h may penetrate beyond the insulating layer 301 such that the redistribution pattern 330 may extend into the heavily doped regions 300B, or even reach the conductive pad structures 304 to thereby increase the contact area (as shown in FIG. 3G. In other words, the insulating layer 301 may be at the bottom of the openings 300h or below the openings.

Figure 4:
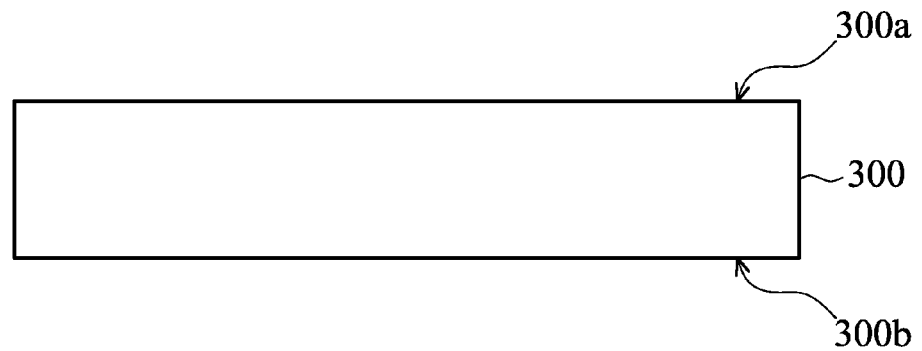
FIGS. 4-5 are cross sections showing a method for fabricating a semiconductor chip according to another embodiment of the invention.
Figure 5:
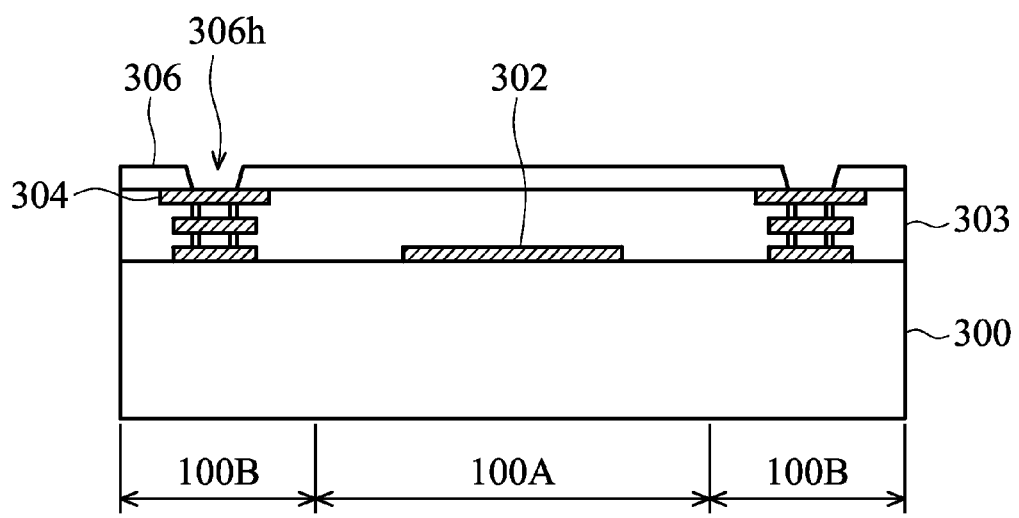

Referring to FIGS. 4-5, cross-sectional views illustrating the steps for forming a chip package on a semiconductor wafer according to another embodiment of the invention are shown. In this embodiment, the heavily doped regions are disposed in a carrier substrate. As shown in FIGS. 4-5, a semiconductor wafer 300 is first provided, which is typically a silicon wafer. The semiconductor wafer includes an upper surface 300a and a bottom surface 300b. In addition, a plurality of scribe line regions and substrates corresponding to chips are defined in the semiconductor wafer, wherein each of the chips includes at least one device region 100A surrounded by a peripheral bonding pad region 100B. Thereafter, a semiconductor device 302 such as an image sensor device or MEMS is fabricated on the upper surface 300a in the device region 100A. Overlying the semiconductor wafer 300 and the semiconductor device 302 is an intermetal dielectric (IMD) layer 303, which is typically a low-k dielectric such as porous oxide. A plurality of conductive pad structures 304 are fabricated in the IMD layer 303 on the peripheral bonding pad region 100B. The conductive pad structures 304 are preferably made of materials such as copper (Cu), aluminum (Al), or other suitable metals.

In addition, the semiconductor wafer 300, produced by wafer foundries, may be covered with a chip passivation layer 306. Meanwhile, in order to electrically connect the devices in the chip to external circuits, the chip passivation layer 306 may be defined in advance by wafer foundries to form a plurality of openings 306h exposing the conductive pad structures 304.

Figure 6A:
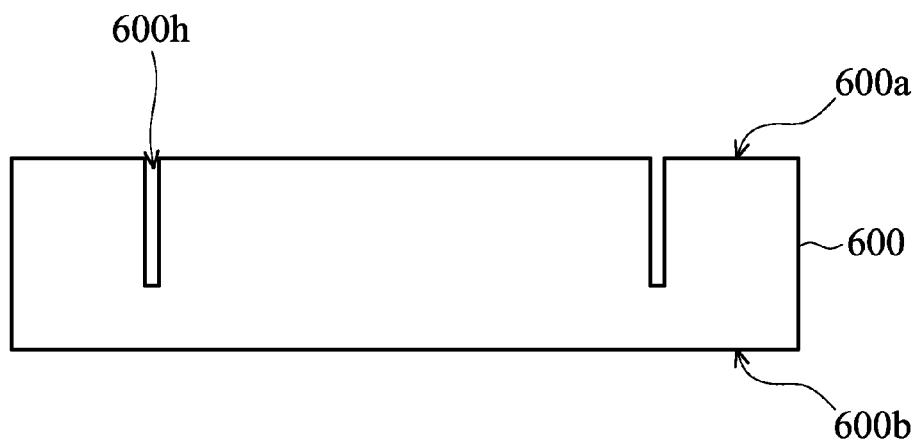
FIGS. 6A-6B are cross sections showing a method for fabricating a semiconductor chip according to yet another embodiment of the invention.
Figure 6B:
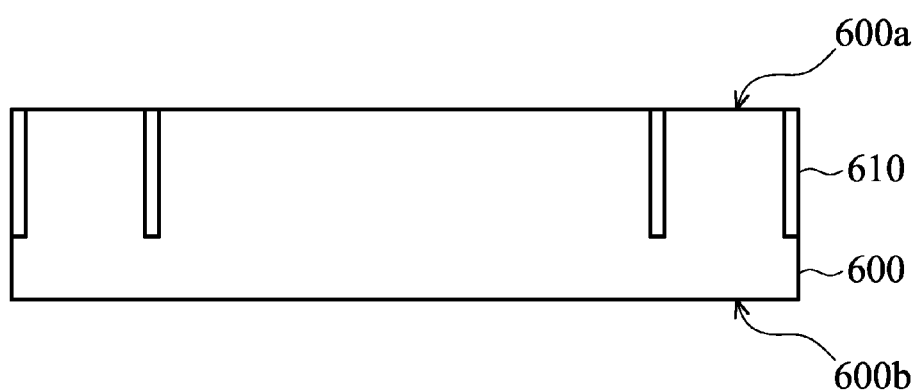

Next, as shown in FIG. 6A, a semiconductor wafer 600 such as a blank silicon wafer or a silicon wafer with integrated circuits is provided as a carrier substrate, which includes an upper surface 600a and a bottom surface 600b. A plurality of openings 600h are formed by removing portions of the semiconductor wafer 600 from the upper surface 600a. The openings 600h are then filled with insulating layers 610, for example, formed of polymer materials such as polyimide. Alternatively, an insulating layer such as silicon oxide may be formed by semiconductor processing steps. For example, a silicon oxide layer is blanketly formed by thermal oxidation or plasma chemical vapor deposition processes, and thereafter, the oxide layer on the upper surface 600a and/or bottom surface 600b of the silicon wafer 600 may be removed. It should be noted that the silicon wafer 600 is a heavily doped substrate, which may be formed by doping ions (e.g., phosphors or arsenic ions) of a high concentration (e.g., 1E14-6E15 atoms/cm2) by, for example, diffusion or ion implantation processes, to form a conductive path. In an embodiment, one heavily doped region corresponds to one conductive pad structure. However, when a plurality of conductive pad structures are used as a common output, one heavily doped region may correspond to a plurality of conductive pad structures at the same time.

Figure 7A:
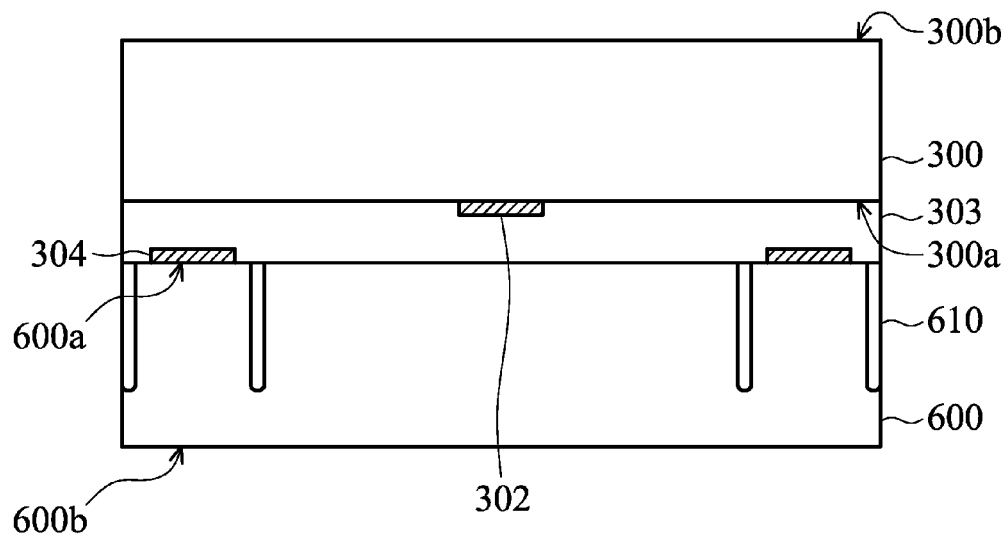
FIGS. 7A-7D are cross sections showing a method for fabricating a semiconductor chip according to a further embodiment of the invention.

Referring to FIG. 7A, the semiconductor substrate 300 with a semiconductor device is bonded to the carrier substrate 600. For example, the semiconductor substrate 300 is flipped upside down with its upper surface 300a bonded to the upper surface 600a of the carrier substrate 600 such that the semiconductor device 302 is away from the carrier substrate 600, while the conductive pad structures 304 are facing and bonded to the upper surface 600a of the carrier substrate 600. For simplicity, only the conductive pad structures 304, the semiconductor device 302, and the IMD layer 303 are shown in the semiconductor substrate 300.

Figure 7B:
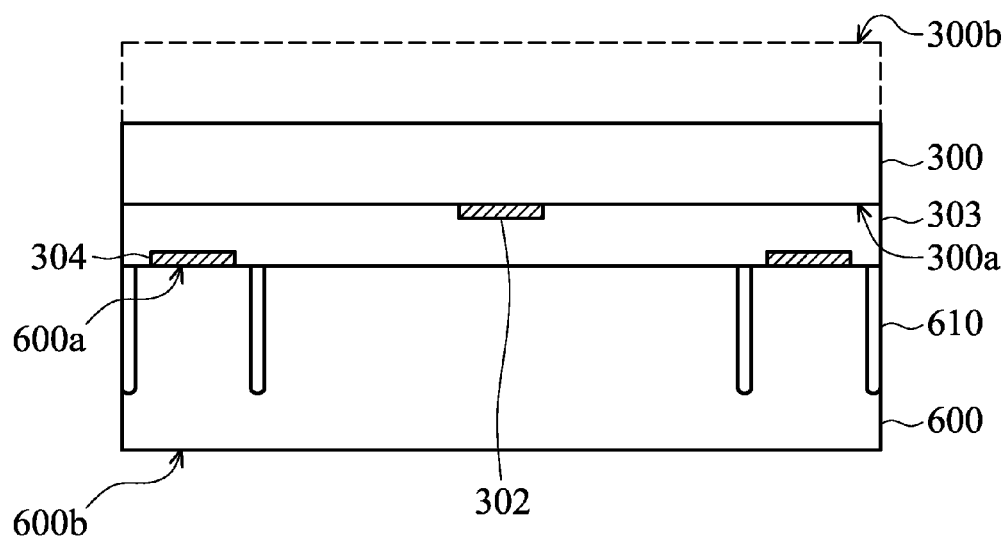

Thereafter, as shown in FIG. 7B, the semiconductor substrate 300 is thinned from the bottom surface 300b thereof (as indicated by the dash lines) to a suitable thickness by, for example, etching, milling, grinding, or polishing processes. For example, when the semiconductor device is an image sensor, the thinned silicon substrate 300 should be thin enough to permit a sufficient amount of light to pass therethrough for the image sensor 302 to sense incident light and generate signals. In this embodiment, the bottom surface 300b of the semiconductor substrate 300 is used as a light incident surface.

Figure 7C:
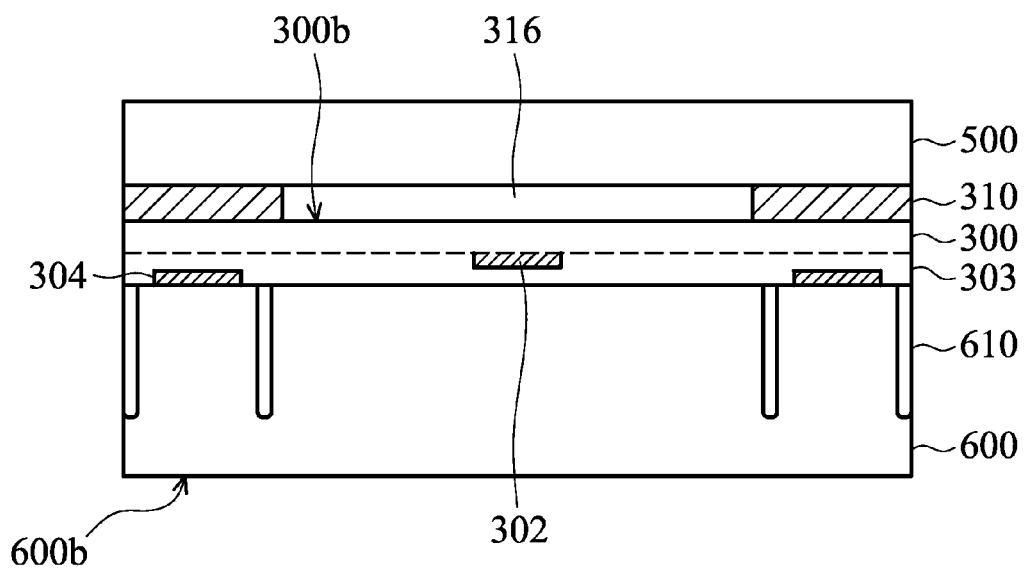

After completion of the thinning process, a packaging layer 500 is bonded to the bottom surface 300b of the semiconductor wafer 300, as shown in FIG. 7C. The packaging layer may be for example, a transparent substrate such as glass, another blank silicon wafer, or another wafer having integrated circuits. In one embodiment, a spacer layer 310 is used to separate the packaging layer 500 and the semiconductor substrate such that a cavity 316 surrounded by the spacer layer 310 is formed. The spacer layer 310 may be a sealant resin or a photosensitive insulating material, such as epoxy, solder mask, and so on. In addition, the spacer layer 310 may be formed on the bottom surface 300b of the silicon substrate 300, and then bonded with the opposing packaging layer 500 using an adhesion layer. On the other hand, the spacer layer 310 may also be formed on the packaging layer 500, and then bonded with an opposing bottom surface 300b of the silicon substrate 300 using an adhesion layer.

Figure 7D:
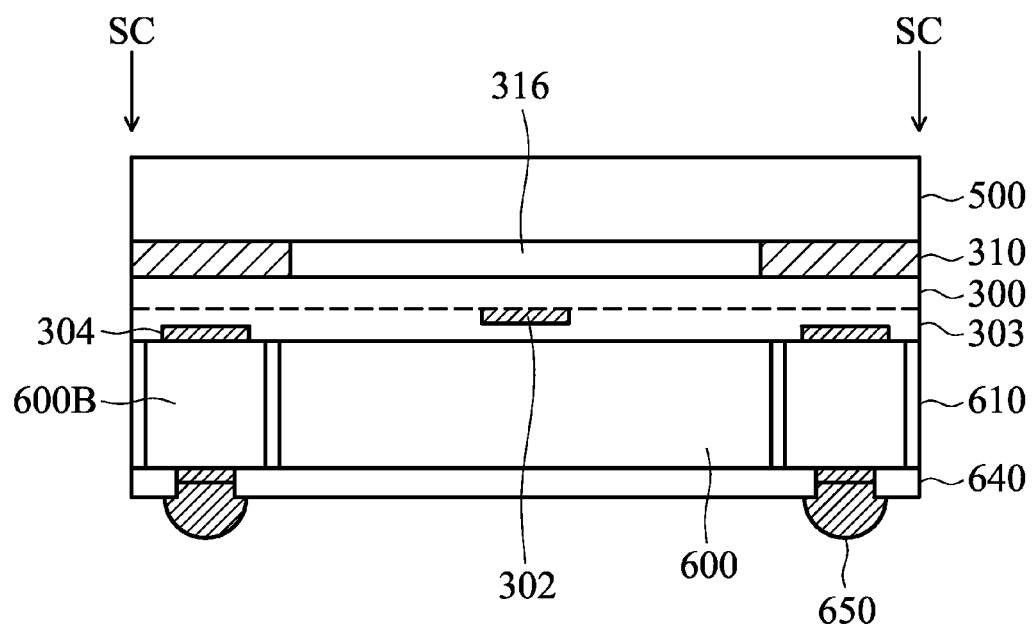

FIG. 7D illustrates an optional process, wherein the carrier substrate is thinned from the bottom surface 600b thereof, using the packaging layer 500 as a supporting substrate. For example, the backside 600b of the carrier substrate is polished by a chemical mechanical polishing process to expose surfaces of the insulating layers 610 such that the insulating layers constitute an insulating wall 610 to isolate the heavily doped regions 600B in the carrier substrate 600 which correspond to the peripheral bonding pad regions 100B.

Thereafter, a passivation layer 640 is formed. In an embodiment of the invention, the passivation layer 640 may, for example, be a solder mask. A solder mask material may be applied overlying the bottom surface 600b of the carrier substrate 600b to form the passivation layer 640. Then, the passivation layer 640 is patterned to form a plurality of contact openings, exposing portions of the bottom surface 600b of the carrier substrate. Then, an under bump metallurgy (UBM) and a conductive bump 350 are formed at the contact openings. For example, the UBM may be formed of a conductive material such as a metal or metal alloy, and may be nickel, silver, aluminum, cooper, or alloys thereof. Alternatively, the UBM may be a doped polysilicon, single crystalline silicon, or conducting glass layer. In addition, a refractory metal material such as titanium, molybdenum, chromium, or titanium-tungsten layer may be used alone or in combination with other metal layers. In a specific embodiment, a redistribution pattern can be used to redistribute the position of the conductive bump 650.

In an embodiment of the invention, the conductive bump 650 is used to transmit input/output (I/O), ground, or power signals of the device 302. Subsequently, the semiconductor wafer is diced along the scribe line SC on the peripheral bonding pad region, to thereby form a plurality of chip packages.

In addition, the heavily doped regions 600B in the carrier substrate 600 which correspond to the peripheral bonding pad region are isolated by the insulating wall 610. Therefore, the conductive bumps 650 can electrically connect to the heavily doped regions 600B by direct contact or by the redistribution pattern. It is not necessary for the conductive bumps 650 to be in direct contact with the conductive pad structures 304. In addition, the heavily doped regions 600B in the carrier substrate 600 which correspond to the peripheral bonding pad regions may have an area that is wider than that of the conductive pad structures such that the contact openings have a larger process window for alignment.

Figure 8A:
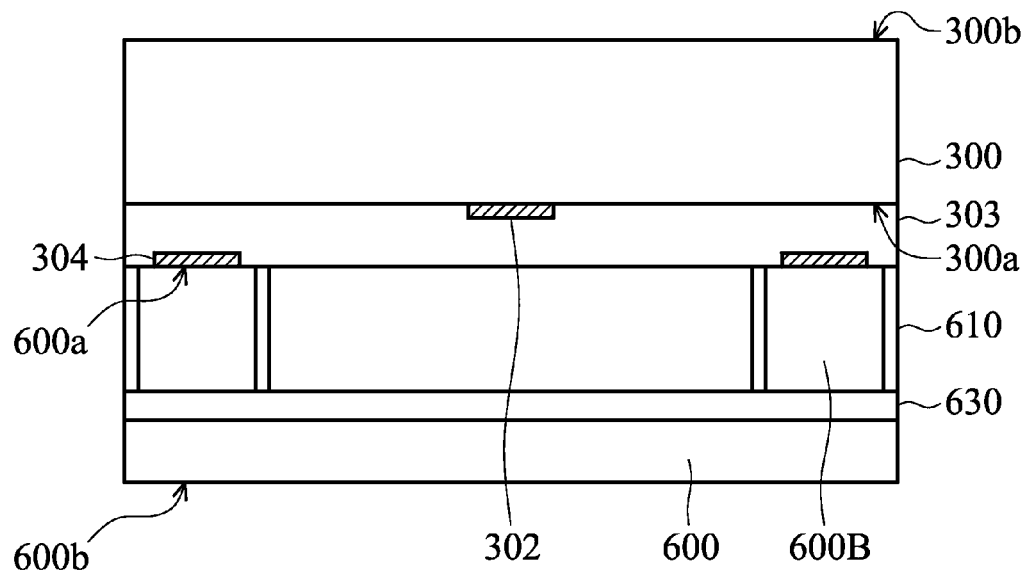
FIGS. 8A-8D are cross sections showing a method for fabricating a semiconductor chip according to a still further embodiment of the invention.
Figure 8B:
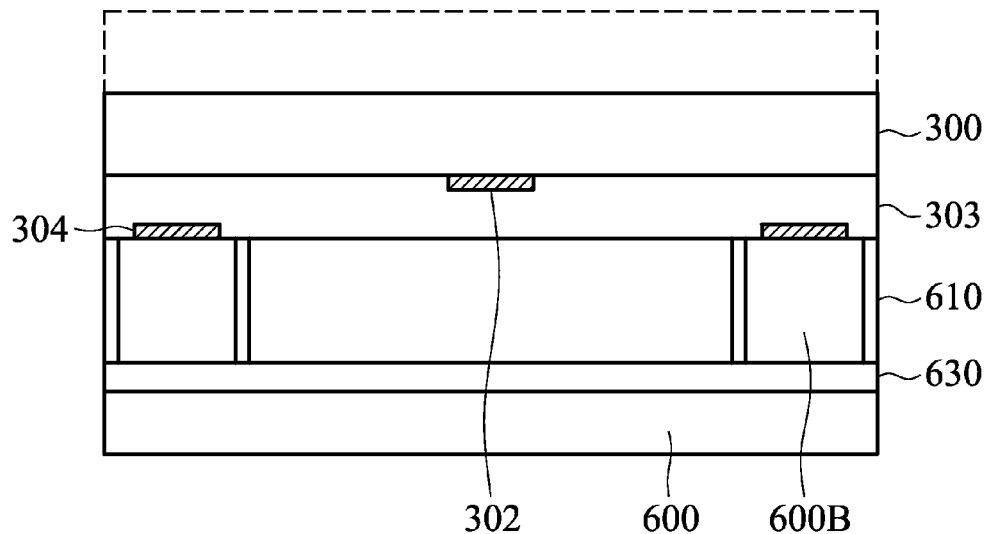
Figure 8C:
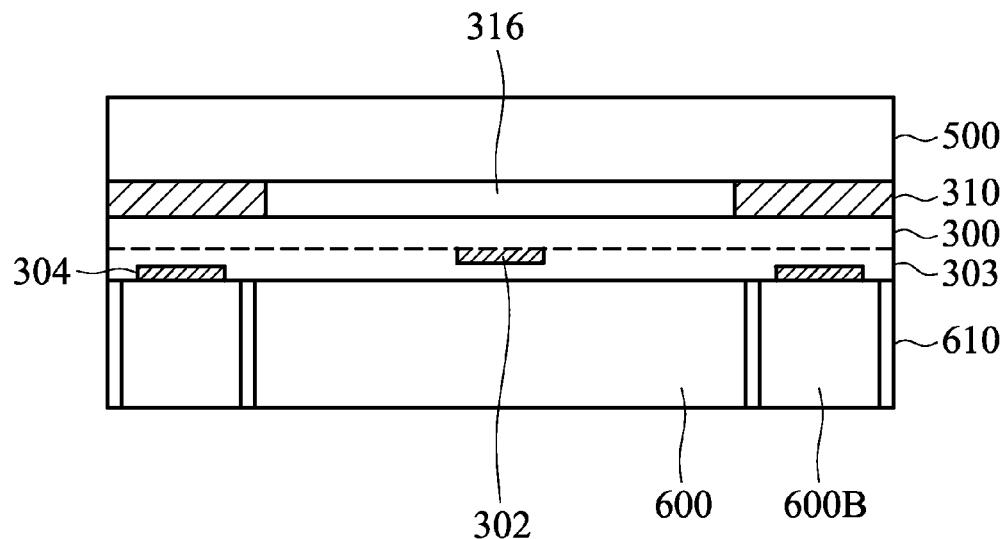
Figure 8D:
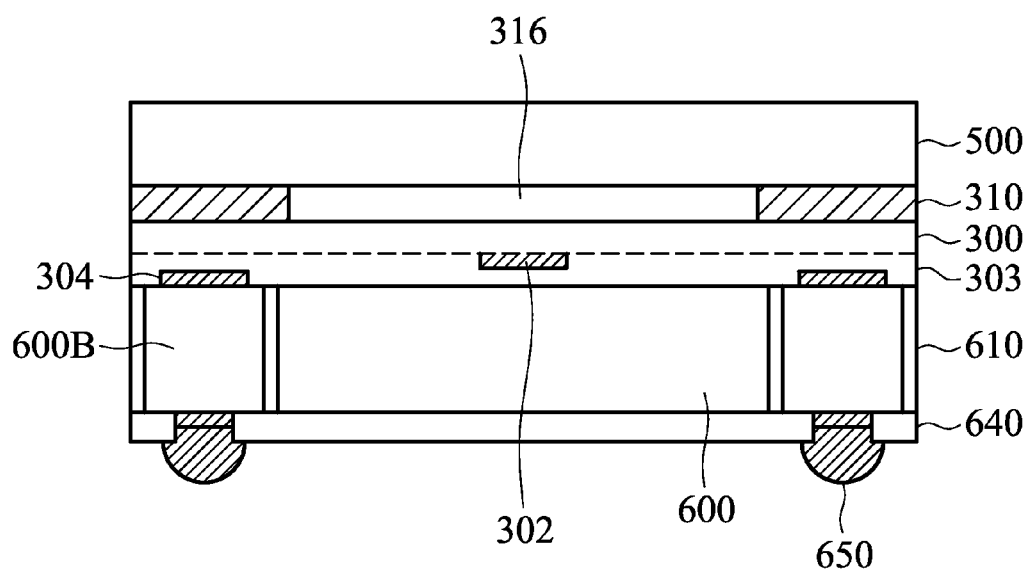

Referring to FIGS. 8A-8D, cross-sectional views showing the steps for forming a chip package according to another embodiment of the invention are shown, wherein a primary difference with the previous embodiment is that the carrier substrate 600 is a silicon-on-insulator (SOI) substrate which includes an insulating layer 630. Insulating walls 610 extending to the insulating layer 630 are formed in the carrier substrate 600 to isolate the heavily doped regions 600B which correspond to the peripheral bonding pad regions 100B. The insulating walls and the insulating layer may be formed of silicon oxide. The heavily doped regions 600B may be formed by an ion implantation process, which may be performed before or after the formation of the insulating walls 610. Next, as shown in FIG. 8B, a portion of thickness of the semiconductor wafer 300 is removed from the backside 300b thereof. Referring to FIGS. 8C-8D, the carrier substrate 600 is thinned after a packaging layer 500 is disposed thereon, and then a passivation layer 640 and conductive bumps 650 are formed in sequence. However, in another embodiment, the insulating layer 630 is not removed but left intact during the thinning process of the carrier substrate 600. In other embodiments, the insulating layer 630 is formed by semiconductor processing steps such as a thermal oxidation and chemical vapor deposition step. Alternatively, the insulating layer is formed by combing two wafers together, using a wafer bonding process, wherein one of the wafers is provided with an insulating layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate having opposite first and second surfaces;
   a conductive pad structure disposed on the first surface of the semiconductor substrate;
   a heavily doped region underlying and electrically connected to the conductive pad structure;
   a conductive feature underlying the heavily doped region and electrically connected to the conductive pad structure through the heavily doped region;
   a semiconductor device on the first surface of the semiconductor substrate; and
   an opening penetrating into the semiconductor substrate from the second surface thereof to expose the heavily doped region, wherein the conductive feature comprises a conductive pattern in the openings to electrically connect to the heavily doped region, and the conductive pattern extends into the heavily doped region, wherein the opening is located between two opposite outer walls of the semiconductor substrate.

2. The chip package as claimed in claim 1, wherein the conductive feature comprises a conductive bump, a conductive pattern, or combinations thereof.

3. The chip package as claimed in claim 1, wherein the conductive pattern in the opening is isolated from the semiconductor substrate by an insulating layer.

4. The chip package as claimed in claim 1, wherein the substrate further comprises at least one bond pad region, and at least one device region, wherein the conductive pad structure is disposed on the bond pad region.

5. The chip package as claimed in claim 4, further comprising:
   a packaging layer bonded to the semiconductor substrate;
   a spacer surrounding the device region and disposed between the semiconductor substrate and the packaging layer to form a cavity therebetween.

6. The chip package as claimed in claim 1, further comprising a plurality of heavily doped regions isolated from one another by an insulating wall.

7. The chip package as claimed in claim 6, further comprising an insulating layer below the heavily doped regions, wherein the insulating wall extends to the insulating layer.

8. The chip package as claimed in claim 1, wherein the area of the heavily doped region is wider than that of the conductive pad structure.

9. The chip package as claimed in claim 1, wherein the heavily doped region is disposed in a carrier substrate which is bonded to the first surface of the semiconductor substrate.

10. The chip package as claimed in claim 9, wherein the carrier substrate is a silicon-on-insulator substrate.

11. The chip package as claimed in claim 1, wherein the conductive pattern extends into the heavily doped region and reaches the conductive pad structure.

12. A method for fabricating a chip package, comprising:
   providing a semiconductor wafer having opposite first and second surfaces, wherein the semiconductor wafer comprises a conductive pad structure on the first surface of the semiconductor substrate;
   forming a heavily doped region underlying the conductive pad structure, wherein the heavily doped region is electrically connected to the conductive pad structure;
   forming a conductive feature underlying the heavily doped region, wherein the conductive feature is electrically connected to the conductive pad structure through the heavily doped region;
   forming a semiconductor device on the first surface of the semiconductor substrate; and
   forming an opening penetrating into the semiconductor substrate from the second surface thereof to expose the heavily doped region, wherein the conductive feature comprises a conductive pattern in the openings to electrically connect to the heavily doped region, and the conductive pattern extends into the heavily doped region,
wherein the opening is located between two opposite outer walls of the semiconductor substrate.

13. The method as claimed in claim 12, wherein the step of forming the conductive feature comprises forming a conductive bump, a conductive pattern, or combinations thereof.

14. The method as claimed in claim 12, wherein the conductive pattern extends into the heavily doped region.

15. The method as claimed in claim 12, further comprising forming an insulating layer in the openings to isolate the conductive pattern from the semiconductor wafer.

16. The method as claimed in claim 12, wherein the substrate further comprises at least one bond pad region, and at least one device region, wherein the conductive pad structure is disposed on the bond pad region.

17. The method as claimed in claim 16, further comprising:
bonding a packaging layer to the semiconductor wafer, wherein a cavity surrounded by a spacer is formed between the packaging layer and the semiconductor wafer.

18. The method as claimed in claim 12, further comprising forming a plurality of heavily doped regions and an insulating wall therebetween the heavily doped regions to isolate the heavily doped regions from one another.

19. The method as claimed in claim 18, further comprising forming an insulating layer below the heavily doped regions, wherein the insulating wall extends to the insulating layer.

20. The method as claimed in claim 12, wherein the area of the heavily doped region is wider than that of the conductive pad structure.

21. The method as claimed in claim 12, wherein the step of forming the heavily doped region comprises forming a plurality of heavily doped regions in a carrier substrate, and the method further comprises bonding the carrier substrate to the first surface of the semiconductor wafer.

22. The method as claimed in claim 21, wherein the carrier substrate is a silicon-on-insulator substrate.

23. The method as claimed in claim 21, further comprising forming an insulating wall to isolate the heavily doped regions from one another, wherein the step of forming the insulating wall comprises:
forming a plurality of openings from a first surface of the carrier substrate;
forming an insulating layer in the openings of the carrier substrate; and
polishing the carrier substrate from a second surface opposite to the first surface of the carrier substrate, to thereby form the insulating wall to isolate the heavily doped regions.

24. The method as claimed in claim 23, further comprising bonding a packaging layer to the semiconductor wafer, wherein the step of the forming the insulating wall is performed after the bonding of the packaging layer.

25. The method as claimed in claim 12, further comprising dicing the semiconductor wafer to form a plurality of individual chip packages.

* * * * *